United States Patent
Eroz et al.

(10) Patent No.: US 8,140,931 B2
(45) Date of Patent: *Mar. 20, 2012

(54) METHOD AND SYSTEM FOR GENERATING PARALLEL DECODABLE LOW DENSITY PARITY CHECK (LDPC) CODES

(75) Inventors: Mustafa Eroz, Germantown, MD (US); Feng-Wen Sun, Germantown, MD (US); Lin-Nan Lee, Potomac, MD (US)

(73) Assignee: DTVG Licensing, Inc., El Segundo, CA (US)

( * ) Notice: Subject to any disclaimer, the term of this patent is extended or adjusted under 35 U.S.C. 154(b) by 1166 days.

This patent is subject to a terminal disclaimer.

(21) Appl. No.: 11/938,095

(22) Filed: Nov. 9, 2007

(65) Prior Publication Data

US 2008/0065953 A1 Mar. 13, 2008

Related U.S. Application Data

(63) Continuation-in-part of application No. 10/882,705, filed on Jul. 1, 2004, now Pat. No. 7,296,208.

(60) Provisional application No. 60/484,974, filed on Jul. 3, 2003.

(51) Int. Cl.
*H03M 13/00* (2006.01)

(52) U.S. Cl. ............... 714/752; 714/757; 714/781

(58) Field of Classification Search .......... 714/752, 714/757, 801, 781, 799
See application file for complete search history.

(56) References Cited

U.S. PATENT DOCUMENTS

| 6,895,547 B2 * | 5/2005 | Eleftheriou et al. ........ 714/801 |
| 7,055,090 B2 * | 5/2006 | Kikuchi et al. .............. 714/801 |
| 2003/0033575 A1 | 2/2003 | Richardson et al. |
| 2004/0187129 A1 | 9/2004 | Richardson |
| 2005/0240853 A1 | 10/2005 | Yokokawa et al. |

FOREIGN PATENT DOCUMENTS

| EP | 1494358 | 1/2005 |
| JP | 2002-094405 | 3/2002 |
| WO | WO 01/97387 | 12/2001 |

OTHER PUBLICATIONS

Mansour, M. M. et al; "Architecture-Aware Low-Density Parity-Check Codes", Proc., IEEE International Symposium on Circuits and Systems, Bangkok, Thailand, vol. 2 of 5, May 25, 2003, pp. II-57, XP002302868, ISBN: 0-7803-7761-3.

Boutillion E. et al; "Decoder-First Code Design", Proc., International Symposium on Turbo Codes and Related Topics, Brest, France, Sep. 4, 2000, pp. 459-462, XP008011934.

Verdier, Francois, Declercq, David, Philippe Jean.-Marc; "Parallelization and FPGA Implementation of an LDPC Decoder"; JFAAA 2002; Monastir, Tunisia; Dec. 2002; XP002329887.

Calzolari, G. P.; "Report on DVB-S2 Channel Coding Standardization Effort", Sub-Panel Channel Coding Meeting Report, Apr. 2003, XP002311762.

(Continued)

*Primary Examiner* — Fritz Alphonse

(57) ABSTRACT

An approach is provided for efficiently decoding low density parity check (LDPC) codes. A plurality of parallel processors decode the LDPC codes mapped by accessing a mapped matrix in a memory structure. The mapped matrix is constructed based on a parity check matrix of the LDPC codes. No two different entries in an identical row of the mapped matrix connects to identical bit nodes or identical check nodes.

24 Claims, 10 Drawing Sheets

OTHER PUBLICATIONS

Zhang, T., Parhi K.K.; "An FPGA Implementation of (3,6)-regular Low-Density Parity-Check Code Decoder", Eurasip Journal on Applied Signal Processing, vol. 14, No. 2, Jun. 2003, pp. 530-542, XP002329888.

Wadayama, Tadashi; "A Coded Modulation Scheme Based on Low Density Parity Check Codes"; IEICE Trans. Fundamentals; vol. E84-A, No. 10; Oct. 2001.

Sun, Shao-Hui; Sun, Rong; Wang, Xinmei; "Some Quantization Issues for Decoding of Low-Density Parity Check Codes with BP Algorithm"; ACTA Electronica Sinica; vol. 31, No. 2; Feb. 2003; pp. 217-220; Tsinghua Tongfang Optical Disc. Co. Ltd.

Summons to Oral Proceedings dated Oct. 13, 2009 in European Patent Application No. 03763495.3 filed Jul. 3, 2003 by Mustafa Eroz et al.

Howland, C. and Blanksby, A.; "Parallel Decoding Architectures for Low Density Parity Check Codes"; 2001 IEEE International Symposium on Circuits and Systems (ISCAS 2001); vol. 4; pp. IV-742-IV-745.

EPO Summons to attend oral proceedings dated Feb. 13, 2008 in European counterpart Application No. 04254015.3 of corresponding U.S. Appl. No. 10/882,705, filed Jul. 1, 2004 by Feng-Wen Sun et al., now U.S. Patent No. 7,296,208.

EPO Communication dated Feb. 21, 2006 in European counterpart Application No. 04254015.3 of corresponding U.S. Appl. No. 10/882,705, filed Jul. 1, 2004 by Feng-Wen Sun et al., now U.S. Patent No. 7,296,208.

Canadian Office Action dated Jul. 17, 2006 in Canadian counterpart Application No. 2,472,787 of corresponding U.S. Appl. No. 10/882,705, filed Jul. 1, 2004 by Feng-Wen Sun et al., now U.S. Patent No. 7,296,208.

Chinese Office Action dated Mar. 3, 2006 in Chinese counterpart Application No. 200410092122.4 of corresponding U.S. Appl. No. 10/882,705, filed Jul. 1, 2004 by Feng-Wen Sun et al., now U.S. Patent No. 7,296,208.

Chinese Office Action dated Dec. 15, 2006 in Chinese counterpart Application No. 200410092122.4 of corresponding U.S. Appl. No. 10/882,705, filed Jul. 1, 2004 by Feng-Wen Sun et al., now U.S. Patent No. 7,296,208.

Japanese Office Action dated Jun. 27, 2006 in Japanese counterpart Application No. 2004197022 of corresponding U.S. Appl. No. 10/882,705, filed Jul. 1, 2004 by Feng-Wen Sun et al., now U.S. Patent No. 7,296,208.

Japanese Office Action dated Jan. 9, 2007 in Japanese counterpart Application No. 2004-197022 of corresponding U.S. Appl. No. 10/882,705, filed Jul. 1, 2004 by Feng-Wen Sun et al., now U.S. Patent No. 7,296,208.

Korean Office Action dated Jan. 26, 2006 in Korean counterpart Application No. 10-2004-51588 of corresponding U.S. Appl. No. 10/882,705, filed Jul. 1, 2004 by Feng-Wen Sun et al., now U.S. Patent No. 7,296,208.

* cited by examiner

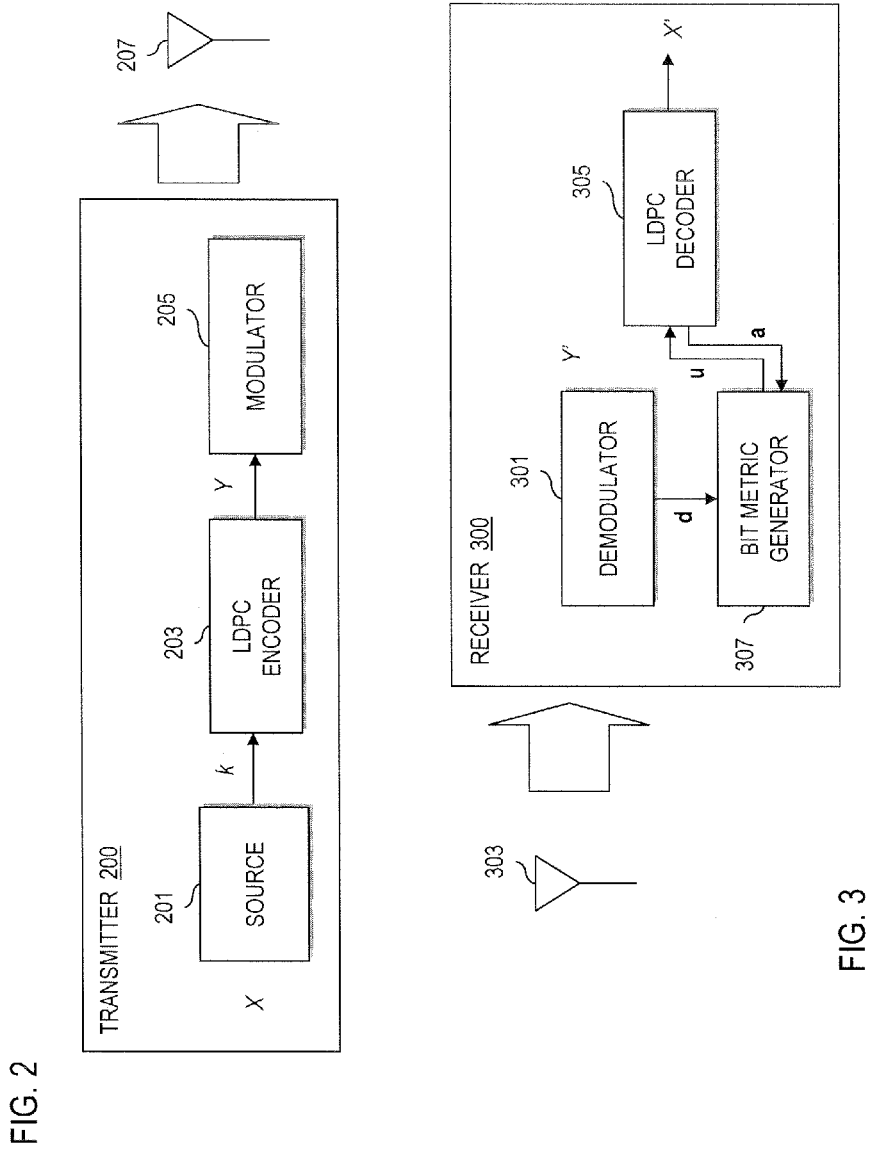

$$H = \begin{bmatrix} n_1 & n_2 & n_3 & n_4 & n_5 & n_6 & n_7 & n_8 \\ 1 & 0 & 0 & 1 & 1 & 0 & 0 & 1 \\ 0 & 1 & 1 & 0 & 1 & 0 & 1 & 0 \\ 1 & 0 & 1 & 0 & 0 & 1 & 0 & 1 \\ 0 & 1 & 0 & 1 & 0 & 1 & 1 & 0 \end{bmatrix} \begin{matrix} m_1 \\ m_2 \\ m_3 \\ m_4 \end{matrix}$$

METHOD AND SYSTEM FOR GENERATING PARALLEL DECODABLE LOW DENSITY PARITY CHECK (LDPC) CODES

RELATED APPLICATIONS

This application is a continuation of U.S. patent application Ser. No. 10/882,705, filed Jul. 1, 2004, now U.S. Pat. No. 7,296,208, entitled "Method and System for Generating Parallel Decodable Low Density Parity Check (LDPC) Codes," which claims the benefit of the earlier filing date under 35 U.S.C. §119(e) of U.S. Provisional Patent Application (Ser. No. 60/484,974), filed Jul. 3, 2003, entitled "General Parallel Decodable LDPC Codes"; the entireties of which are incorporated herein by reference.

FIELD OF THE INVENTION

The present invention relates to communication systems, and more particularly to coded systems.

BACKGROUND OF THE INVENTION

Communication systems employ coding to ensure reliable communication across noisy communication channels. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic.

From an implementation perspective, a number of challenges are confronted. For example, storage is an important reason why LDPC codes have not become widespread in practice. One of the major issues in LDPC decoding is the organization of memory. Recognizing the fact that the larger the memory size, the lower is the cost of per bit, there is motivation to the investigate of code architectures that allow efficient lumped memory structure for the large amount of edge values in a LDPC decoder.

Also, a key challenge in LDPC code implementation has been how to achieve the connection network between several processing engines (nodes) in the decoder. Further, the computational load in the decoding process, specifically the check node operations, poses a problem.

It is recognized that, in general, a code corresponding to set number of parallel engines cannot be reconfigured to accommodate different numbers of parallel engines such that an efficient memory architecture is maintained. Because different applications require different decoding speeds, this inflexibility presents a serious drawback. Also, this constraint hinders the ability to adopt and exploit advancements in semiconductor capabilities. For instance, as processing power increases, the number of parallel engines needed for a given decoding speed should reduce; however, the design of a fixed number of engines does not permit a straightforward reduction in the number of processors utilized.

Therefore, there is a need for a LDPC communication system that employs efficient decoding processes. There is also a need to minimize storage requirements for implementing LDPC coding. There is a further need for a decoding scheme that can readily accommodate future technological advancements.

SUMMARY OF THE INVENTION

These and other needs are addressed by the present invention, wherein an approach for decoding a structured Low Density Parity Check (LDPC) codes is provided. Criteria for parallel decodable codes are established to generate a mapped matrix corresponding to a parity check matrix. The first criterion is that none of any two different entries in the same row of the mapped matrix connects to the same bit nodes or to the same check nodes. Secondly, if bit node group i, i=0, 1, ... m−1, denoted as $BG_i$, represents all the bit nodes connected to the edges in the ith row, for i≠j, $BG_i$ and $BG_j$, it is ensured that they either have no common node or are identical. This criterion is also imposed on the check nodes, whereby check node group i, i=0, 1, ... m−1, denoted as $CG_i$, represents all the check nodes connected to the edges in the ith row, for i≠j, $CG_i$ and $CG_j$. It is verified that $CG_i$ either has no common node or is identical. These criteria result in LDPC codes that exploit the parallel decoding structure of LDPC codes and provide efficient memory architecture. To preserve the three conditions for efficient parallel processing for fewer than n processors (i.e., m processors, such that m is an integer fraction of n), a parity check matrix is constructed using block matrix $A_{ij}$ that is a n×n density balanced matrix. The block matrix is decomposed under row and column permutation into a matrix having $B_{ij}$ entries, which are m×m density balanced matrices. In view of the bipartite graph, the derived code can be obtained by deleting some edges in the mapped matrix. Under the above arrangement, m parallel engines can be used, thereby enhancing flexibility in implementation.

According to one aspect of an embodiment of the present invention, a method for supporting decoding of low density parity check (LDPC) codes is disclosed. The method includes constructing a mapped matrix based on a parity check matrix associated with the LDPC codes. The mapped matrix satisfies a plurality of parallel decodable conditions for permitting a lumped memory structure that is accessible by a plurality of processors operating in parallel. Additionally, the method includes storing the mapped matrix in memory for decoding the LDPC codes by the processors.

According to another aspect of an embodiment of the present invention, a decoding apparatus for decoding of low density parity check (LDPC) codes is disclosed. The apparatus includes a memory configured to store a mapped matrix that satisfies a plurality of parallel decodable conditions for permitting a lumped memory structure. Additionally, the apparatus includes a plurality of processors operating in parallel, wherein the processors access the memory to decode the LDPC codes.

According to yet another aspect of an embodiment of the present invention, a method for supporting decoding of low density parity check (LDPC) codes is disclosed. The method includes initializing a mapped matrix based on a parity check matrix corresponding to the LDPC codes. The method also includes determining that none of any two different entries in an identical row of the mapped matrix connects to identical bit nodes or identical check nodes. If bit node group, $BG_i$, represents all bit nodes connected to edges in an ith row, for i≠j, $BG_i$ and $BG_j$, the method includes verifying that $BG_i$ either has no common node or is identical. Also, if check node group, $CG_i$, represents all the check nodes connected to edges in an ith row, for i≠j, $CG_i$ and $CG_j$, the method includes verifying that $CG_i$ either has no common node or is identical. Further, the method includes outputting the mapped matrix for storage into memory that is accessible by a plurality of processors operating in parallel to decode the LDPC codes according to the stored mapped matrix.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2 is a diagram of an exemplary transmitter in the system of FIG. 1;

FIG. 3 is a diagram of an exemplary receiver in the system of FIG. 1;

DESCRIPTION OF THE PREFERRED EMBODIMENT

A system, method, and software for efficiently decoding structured Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
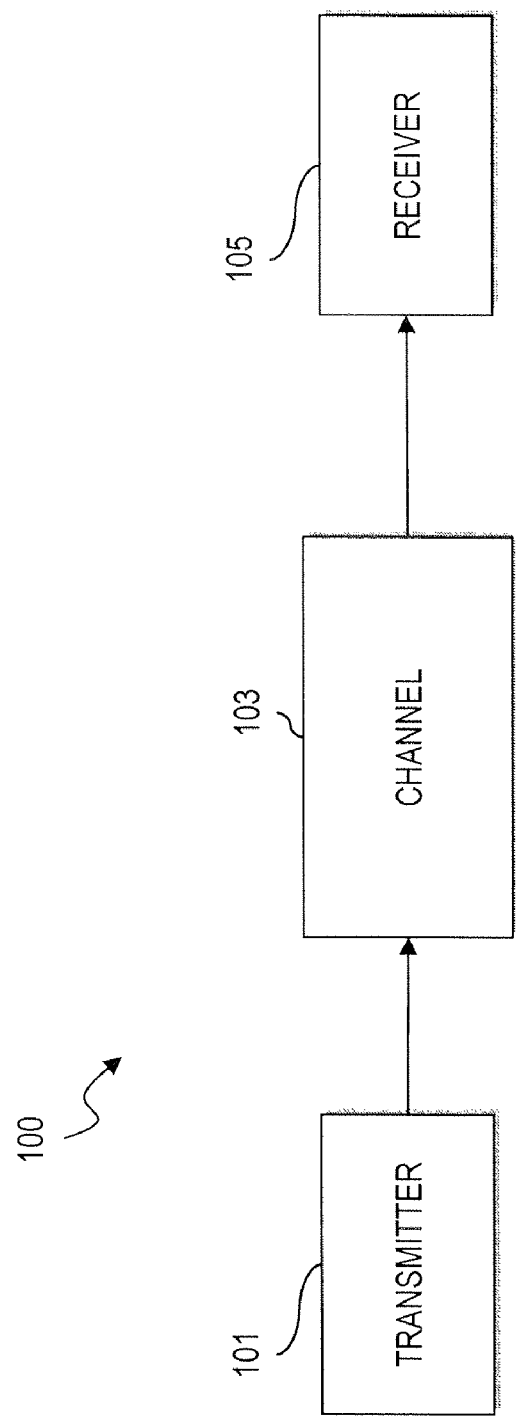
FIG. 1 is a diagram of a communications system configured to utilize Low Density Parity Check (LDPC) codes, according to an embodiment of the present invention.

FIG. 1 is a diagram of a communications system configured to utilize Low Density Parity Check (LDPC) codes, according to an embodiment of the present invention. A digital communications system 100 includes a transmitter 101 that generates signal waveforms across a communication channel 103 to a receiver 105. In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, LDPC codes are utilized.

The LDPC codes that are generated by the transmitter 101 enable high speed implementation without incurring any performance loss. Such LDPC codes have a parallelizable decoding algorithm (unlike turbo codes), which advantageously involves simple operations such as addition, comparison and table look-up. This parallel structure is exploited to minimize memory requirements and to enhance flexibility in terms of utilizing the various quantity of parallel engines (i.e., processors); this is more fully explained later with respect to FIGS. 7-11. Moreover, carefully designed LDPC codes do not exhibit any sign of error floor in the range of interest.

According to one embodiment of the present invention, the transmitter 101 generates LDPC codes based on parity check matrices that facilitate efficient memory access during decoding to communicate with the receiver 105.

FIG. 2 is a diagram of an exemplary transmitter in the system of FIG. 1. A transmitter 200 is equipped with an LDPC encoder 203 that accepts input from an information source 201 and outputs coded stream of redundancy suitable for error correction processing at the receiver 105. The information source 201 generates k signals from a discrete alphabet, X. LDPC codes are specified with parity check matrices.

Modulator 205 maps the encoded messages from encoder 203 to signal waveforms that are transmitted to a transmit antenna 207, which emits these waveforms over the communication channel 103. Accordingly, the encoded messages are modulated and distributed to a transmit antenna 207. The transmissions from the transmit antenna 207 propagate to a receiver, as discussed below.

FIG. 3 is a diagram of an exemplary receiver in the system of FIG. 1. At the receiving side, a receiver 300 includes a demodulator 301 that performs demodulation of received signals from transmitter 200. These signals are received at a receive antenna 303 for demodulation. After demodulation, the received signals are forwarded to a decoder 305, which attempts to reconstruct the original source messages by generating messages, X', in conjunction with a bit metric generator 307. The bit metric generator 307 may exchange information with the decoder 305 back and forth (iteratively) during the decoding process. These decoding approaches are more fully described in co-pending application, entitled "Method and System for Routing in Low Density Parity Check (LDPC) Decoders," filed Jul. 3, 2003 (Ser. No. 10/613,824), which is incorporated herein in its entirety. To appreciate the advantages offered by the present invention, it is instructive to examine how LDPC codes are generated, as discussed in FIG. 4.

Figures 4, 5:
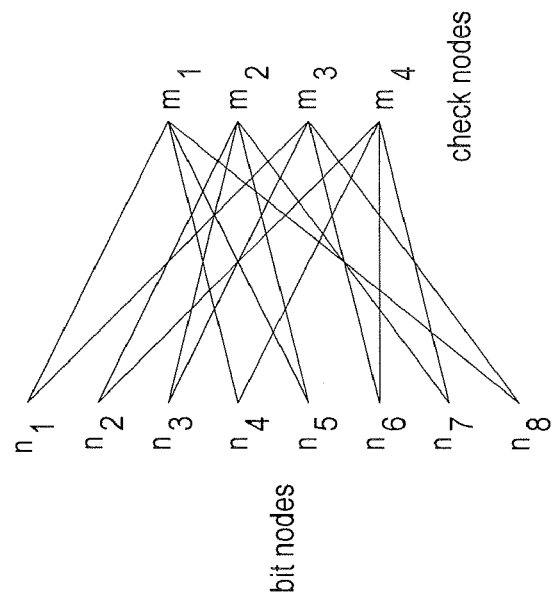
FIG. 4 is a diagram of a sparse parity check matrix, in accordance with an embodiment of the present invention.
FIG. 5 is a diagram of a bipartite graph of an LDPC code of the matrix of FIG. 4.

FIG. 4 is a diagram of a sparse parity check matrix, in accordance with an embodiment of the present invention. LDPC codes are long, linear block codes with sparse parity check matrix $H_{(n-k)\times n}$. Typically the block length, n, ranges from thousands to tens of thousands of bits. For example, a parity check matrix for an LDPC code of length n=8 and rate ½ is shown in FIG. 4. The same code can be equivalently represented by the bipartite graph, per FIG. 5.

FIG. 5 is a diagram of a bipartite graph of an LDPC code of the matrix of FIG. 4. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

The LDPC decoder 305 is considered a message passing decoder, whereby the decoder 305 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

Figure 6:
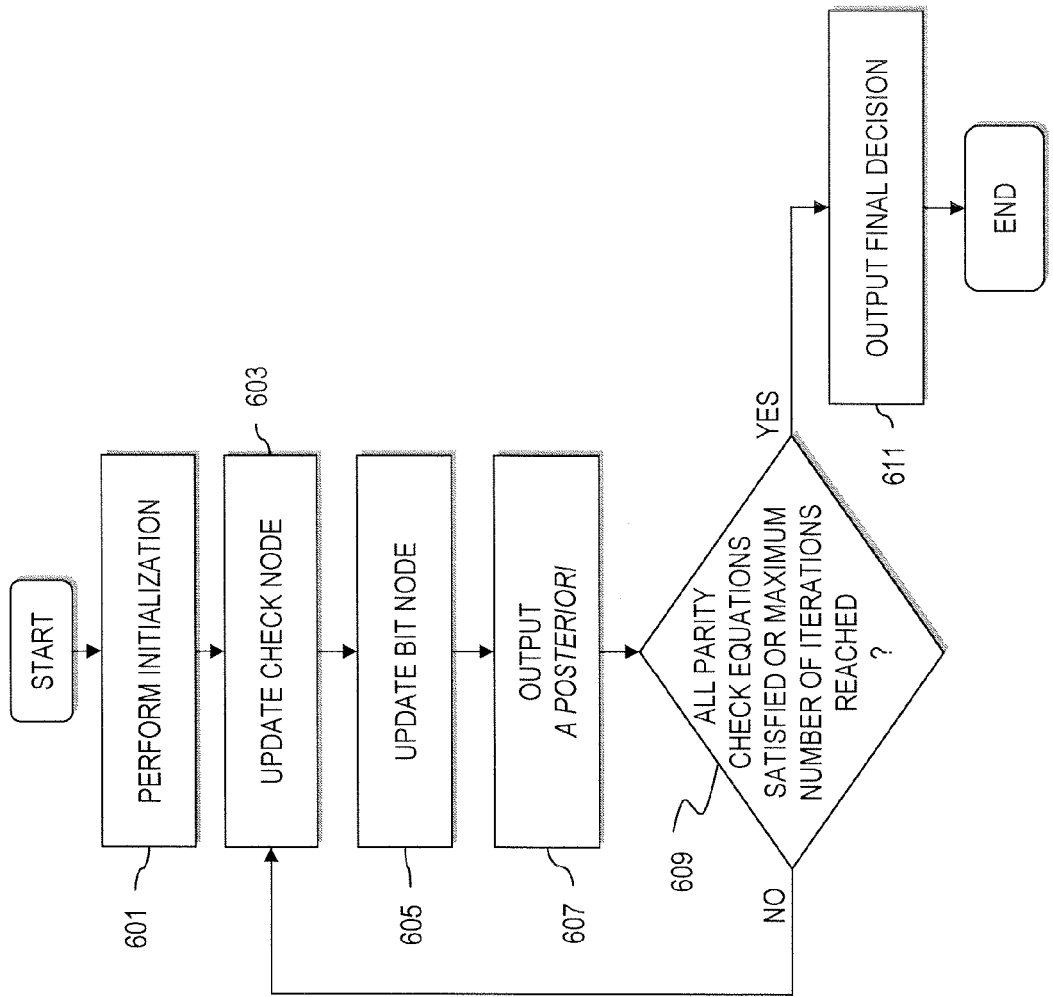
FIG. 6 is a flow chart of the operation of the LDPC decoder of FIG. 3, according to an embodiment of the present invention.

FIG. 6 is a flow chart of the operation of the LDPC decoder of FIG. 3, according to an embodiment of the present invention. It is recognized that one of the most distinguished advantages of LDPC is the potential for parallel decoding. This is evident by inspecting the bipartite graph of an LDPC code and the decoding algorithm. Notably, it is clear that when processing the bit nodes (or check nodes), all the bit nodes (or check nodes) can be processed simultaneously since there is no intermediate data exchange during the processing. For each bit node i, there is a received value $u_i$ that represents the log likelihood ratio of the particular bit is logical zero rather than a logical one; this is referred to as the "channel value." By way of example, a message parsing algorithm for decoding an LDPC code is explained.

In step 601, initialization of the decoder 305 is performed, whereby a value is assigned to each of the edge in the bipartite graph (FIG. 5). This value is equal to the channel value associated with bit node to which the edge is connected. Next, the check node is updated, per step 603. That is, at the end of the check node processing, all the edge values are updated.

Let $e_1, e_2, \ldots, e_v$ denote all the values of all the edges connected to a particular check node, the updated edge values are as follows:

$$e_i = g(e_1, e_2, \ldots, e_{i-1}, e_i, \ldots e_v) \text{ for } i=1, 2, \ldots v,$$

where $$g(a,b) = \ln\frac{1+e^{a+b}}{e^a+e^b}.$$

The function $g(a,b,c)=g(g(a,b), c)$ can be recursively computed.

After all the check nodes processed, the bit nodes are processed with the updated edge values, as in step 605. The goal of the bit node processing is to further update the edge values. Assuming $e_1, e_2, \ldots, e_v$ denote the edge values of all the edges connected to this particular bit node, the updated edge values is as follows:

$$e_i = e_1 + e_2 + \ldots, e_{i-1} + \ldots e_v.$$

The process outputs a posteriori probability information, per step 607, and determines whether the parity check equations are satisfied, or a configurable maximum number of iterations has been reached (step 609). If these equations are not satisfied, steps 603-607 are iteratively executed. At the final iteration, all the edge values associated with one bit node are summed together, and further summed with the channel value to form the final decision metric, per step 611.

Because the LDPC decoder 305 can be implemented as a highly parallel system, two approaches exist to realize the interconnections between check nodes and bit nodes: (1) a fully parallel approach, and (2) a partially parallel approach. In fully parallel architecture, all of the nodes and their interconnections are physically implemented. The advantage of this architecture is speed. The fully parallel architecture, however, may involve greater complexity in realizing all of the nodes and their connections. Therefore with fully parallel architecture, a smaller block size may be required to reduce the complexity.

The second approach to implementing LDPC codes is to physically realize only a subset of the total number of the nodes and use only these limited number of "physical" nodes to process all of the "functional" nodes of the code. Even though the LDPC decoder 305 operations can be made extremely simple and can be performed in parallel, the further challenge in the design concerns how the communication is established between "randomly" distributed bit nodes and check nodes.

Figure 7:
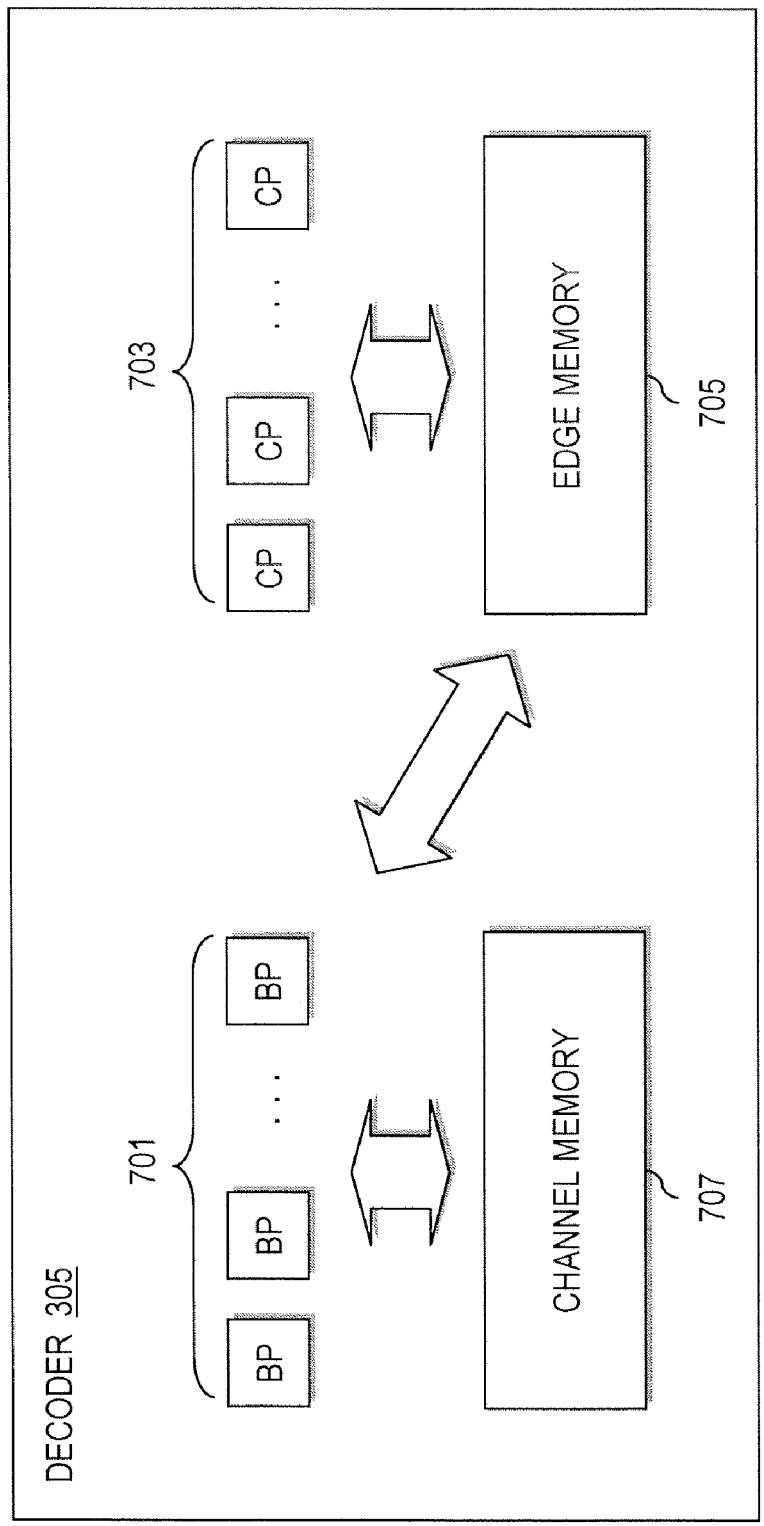
FIG. 7 is a diagram of the components of an LDPC decoder, according to an embodiment of the present invention.

FIG. 7 is a diagram of the components of an LDPC decoder, according to an embodiment of the present invention. The decoder 305 executes the decoding process of FIG. 7 through the use parallel processors. As shown, the decoder 305 includes bit node processors 701 and check node processors 703, which correspondingly perform the bit node and check node operations. The intermediate edge values of bit node or check node updates are buffered in edge memory 705. Also, the partial sum in forming the new edge value during one bit node processing is buffered, typically locally to the processors. A channel memory 707 holds reliability information from the channel. As seen in the figure, the channel reliability memory 707 is used only at bit node processing.

The design of the decoder 305 entails a number of engineering tradeoffs: number of parallel processors versus the speed of decoding; and memory size. In one extreme, a single processor can be used to decode the entire code sequentially from one node to another. However, this approach is hardly useful due to the large number of nodes and number of iterations for a typical good LDPC code. The other extreme is to use as many processors as the number of the nodes. This yields the highest decoding speed and unfortunately the highest cost. Practical decoders are designed between these two extreme approaches.

Clearly, there is a tradeoff between decoding speed and the number of bit node and/or the check node processors. Although the bit node processors 701 and the check node processors 703 are shown are separate components, it is contemplated that the bit node processors 701 can be combined with the check node processors 703 such that they can share part of the data path. Alternatively, the bit node processors 701 can be identical to the check node processors 703 by performing transformation on the edge value before processing. Also, it is noted that the number of bit node processors 701 need not be the same as the number of check node processors 703.

Also, an efficient architecture cannot treat the number of parallel processing engines arbitrarily. It is desirable to have some freedom on the number of parallelism to provide implementation flexibility that will accommodate advances in technological improvements. For instance, if a code is designed to have 360 parallel engines, as the integrated circuit technology improves, the circuit can operate twice as fast. It is thus desirable to reconfigure the same code to have 180 parallel engines, and yet maintain the same decoding architecture.

With respect to the memory structure, the LDPC decoder 305 positions the edge memory 705 close to each of the processors 701, 703. Registers or Random Access Memory (RAM) can be utilized for the memory 705. For long codes, the use of registers is significantly more expensive than RAM. For RAM, it is recognized that cost of per bits decreases as the size of the RAM increases. Therefore, it is advantageous to lump as much RAM together as possible, such that all the edge values are lumped functionally into one RAM.

It is recognized that an arbitrary LDPC code cannot support the decoder architecture of FIG. 7 efficiently. This is made evident by examining the standard RAM architecture. The following observations are noted. A RAM is a memory with predefined width and depth, and can be read from or written into row-wise. This means that at one access cycle, only values within the same row can be accessed. "Random" simply means that the rows can be accessed in arbitrary order from one access cycle to the next. Therefore, from an efficiency standpoint, it is clear that at any given access cycle, each of the bit node processors 701 (or check node processors 703 when processing at the check node side) has to be fed with the same amount of edge value input. Accordingly, at any given moment, an efficient decoder architecture should not starve a processing engine.

Furthermore, it is desirable to dedicate one processor at any given time to a particular bit node (or check node). That is, a processor should not switch to a different bit node (or check node) before the processor finishes updating the edges associated with the one bit node.

The present invention introduces the notion of parallel decodable codes to account for various characteristics of the architecture of FIG. 7, as next described.

Figure 8:
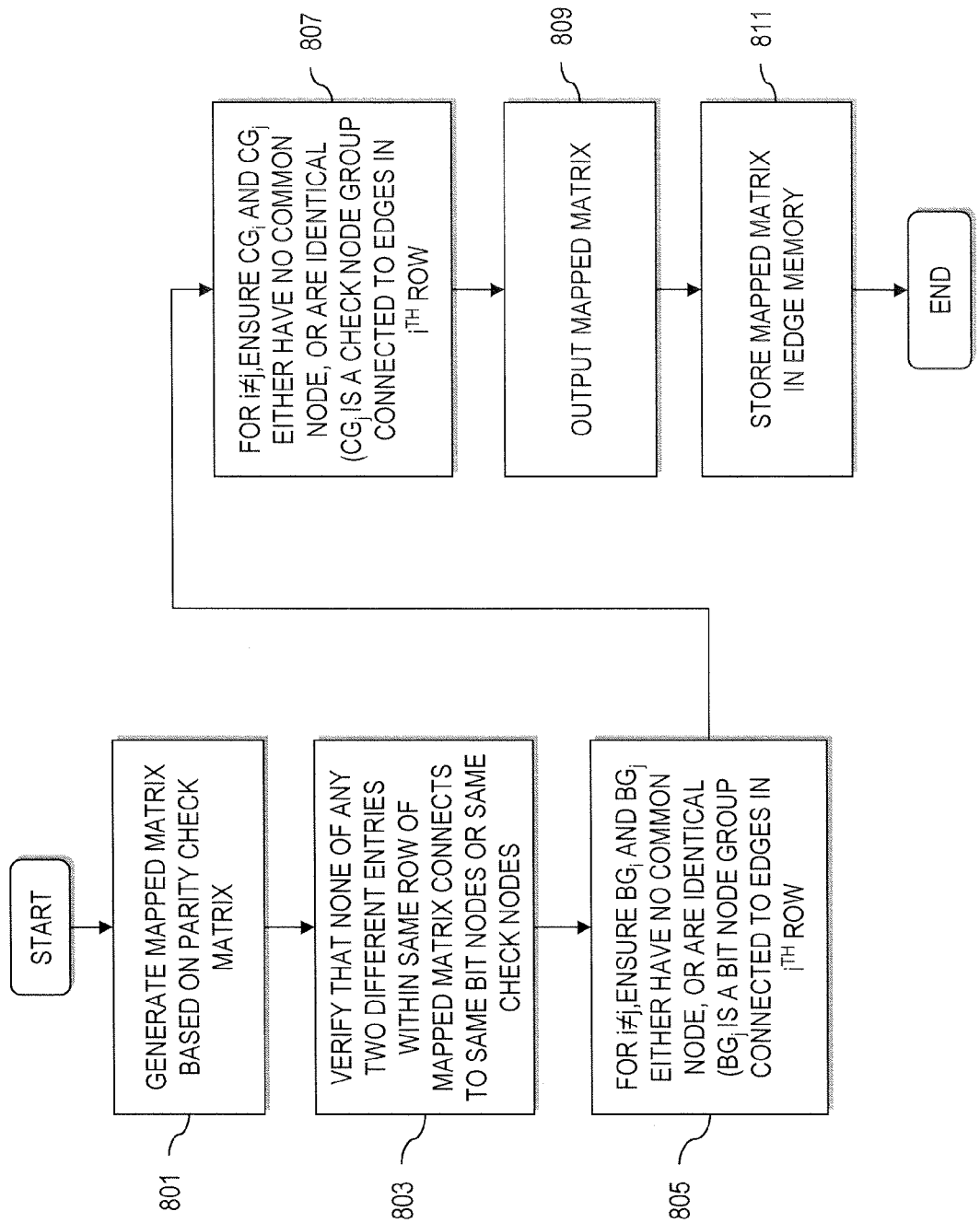
FIG. 8 is a flowchart of a process for generating a mapped matrix for efficient parallel decoding, according to various embodiments of the present invention.

FIG. 8 is a flowchart of a process for generating a mapped matrix for efficient parallel decoding, according to various embodiments of the present invention. Parallel decodable codes are defined to exhibit an efficient memory structure. A LDPC code is decodable with n parallel engines with lumped memory if there is a one-to-one mapping that maps the non-zero entries of the parity check matrix into a matrix of m×n (mapped matrix) that satisfy a number of defined properties. The process for generating this mapped matrix is explained below.

In step 801, a mapped matrix is generated based on the parity check matrix. This mapped matrix is then verified to ensure that the various conditions or properties for efficient parallel decoding. The matrix is verified, per step 803, such that none of any two different entries in the same row of the mapped matrix connects to the same bit nodes or to the same check nodes. Let bit node group i, i=0, 1, ... m−1, denoted as $BG_i$, be all the bit nodes connected to the edges in the ith row, for i≠j, $BG_i$ and $BG_j$, then the process ensures that they either have no any common node or are identical (step 805). Similarly, per step 807, let check node group i, i=0, 1, ... m−1, denoted as $CG_i$, be all the check nodes connected to the edges in the ith row, for i≠j, $CG_i$ and $CG_j$, it is verified that $CG_i$ either has no common node or is identical.

The three conditions of steps 803-807, are necessary to yield efficient parallel processing. In step 809, the mapped matrix is output and stored in edge memory 705 (per step 811). In an exemplary embodiment, the mapped matrix represents the memory structure. This memory can be physically different memory devices that are functionally equivalent to the mapped matrix. The property of step 803 guarantees that in each access cycle, each processor (e.g., processors 701, 703) will receive one and only one value during each access cycle from the edge memory 705.

With n parallel processing engines, all the processors will be evenly loaded. The second property (per step 805) partitions the bit nodes into groups of size n. Two bit nodes are in the same group as long as there are edges associated with the nodes mapped into the same row. Furthermore, it is necessary to hold some intermediate results during the processing for each bit node (or check node) being actively processed. Accordingly, the processing of one set of bit nodes (or check nodes) should be completed before processing new bit nodes (or check nodes); this is ensured by the second and third properties of steps 805 and 807.

Figure 9:
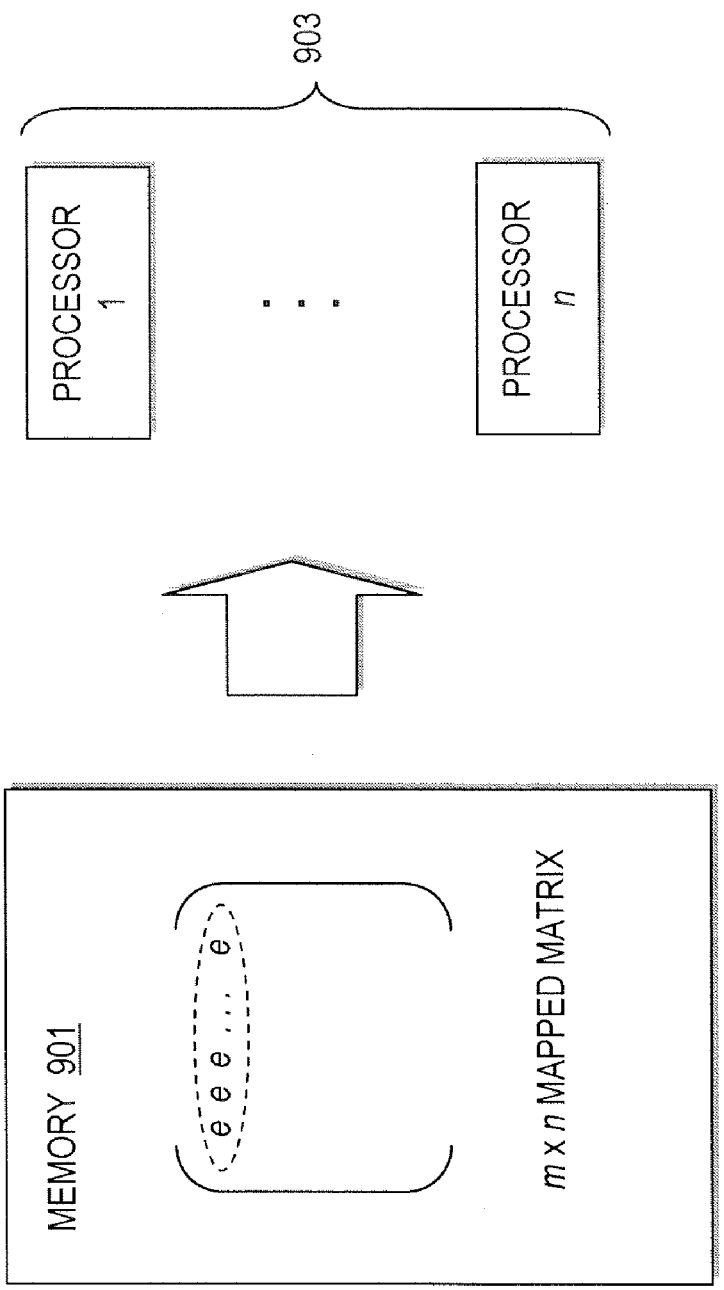
FIG. 9 is a diagram of an LDPC decoder with memory storing a mapped matrix of edge values for supporting parallel decoding, according to an embodiment of the present invention.

FIG. 9 is a diagram of an LDPC decoder with memory storing a mapped matrix of edge values for supporting parallel decoding, according to an embodiment of the present invention. A m×n mapped matrix is stored in memory 901, wherein the edge values are provided to n parallel processors 903. For the purposes of explanation, use of the mapped matrix is described with respect to the following parity check matrix:

$$\begin{bmatrix} 1 & 1 & 0 & 0 & 0 & 0 & 0 & 1 & 0 & 0 & 1 & 0 & 0 & 0 & 0 \\ 0 & 1 & 1 & 0 & 0 & 0 & 1 & 0 & 0 & 0 & 1 & 1 & 0 & 0 & 0 \\ 0 & 0 & 1 & 1 & 0 & 1 & 0 & 0 & 1 & 0 & 0 & 0 & 0 & 0 & 0 \\ 1 & 0 & 0 & 1 & 1 & 0 & 0 & 0 & 0 & 1 & 0 & 0 & 0 & 0 & 0 \\ 1 & 0 & 0 & 0 & 0 & 1 & 0 & 0 & 1 & 0 & 0 & 0 & 1 & 1 & 0 \\ 0 & 1 & 0 & 0 & 0 & 0 & 1 & 0 & 0 & 1 & 0 & 0 & 0 & 1 & 1 \\ 0 & 0 & 1 & 0 & 0 & 0 & 0 & 1 & 0 & 0 & 1 & 0 & 1 & 0 & 0 & 1 \\ 0 & 0 & 0 & 1 & 1 & 0 & 0 & 0 & 0 & 0 & 0 & 1 & 1 & 1 & 0 & 0 \end{bmatrix}$$

During decoding, each nonzero entry of the parity matrix is associated with an edge value. These edge values can be labeled as follows:

$$\begin{bmatrix} e_1 & e_4 & 0 & 0 & 0 & 0 & 0 & e_{19} & 0 & 0 & e_{25} & 0 & 0 & 0 & 0 & 0 \\ 0 & e_5 & e_7 & 0 & 0 & 0 & e_{17} & 0 & 0 & 0 & 0 & e_{27} & 0 & 0 & 0 & 0 \\ 0 & 0 & e_8 & e_{10} & 0 & e_{15} & 0 & 0 & e_{21} & 0 & 0 & 0 & 0 & 0 & 0 & 0 \\ e_2 & 0 & 0 & e_{11} & e_{13} & 0 & 0 & 0 & 0 & e_{23} & 0 & 0 & 0 & 0 & 0 & 0 \\ e_3 & 0 & 0 & 0 & 0 & e_{16} & 0 & 0 & e_{22} & 0 & 0 & 0 & 0 & e_{31} & e_{33} & 0 \\ 0 & e_6 & 0 & 0 & 0 & 0 & e_{18} & 0 & 0 & e_{24} & 0 & 0 & 0 & 0 & e_{34} & e_{35} \\ 0 & 0 & e_9 & 0 & 0 & 0 & 0 & e_{20} & 0 & 0 & e_{26} & 0 & e_{29} & 0 & 0 & e_{36} \\ 0 & 0 & 0 & e_{12} & e_{14} & 0 & 0 & 0 & 0 & 0 & 0 & e_{28} & e_{30} & e_{32} & 0 & 0 \end{bmatrix}$$

The edge values can be mapped one-to-one to the following 9×4 matrix.

$$\begin{bmatrix} e_1 & e_5 & e_8 & e_{11} \\ e_2 & e_4 & e_7 & e_{10} \\ e_3 & e_6 & e_9 & e_{12} \\ e_{13} & e_{15} & e_{17} & e_{19} \\ e_{14} & e_{16} & e_{18} & e_{20} \\ e_{21} & e_{23} & e_{25} & e_{27} \\ e_{22} & e_{24} & e_{26} & e_{28} \\ e_{29} & e_{32} & e_{33} & e_{35} \\ e_{30} & e_{31} & e_{34} & e_{36} \end{bmatrix}$$

The above matrix is a dense matrix with 100% utilization, assuming the matrix mirrors the memory. In other words, all the cells of the memory are fully utilized. It can be readily verified that this mapping satisfies all three properties for efficient parallel decoding, as described above.

In this example, the bit nodes are partitioned into four groups with each group containing four bit nodes, whereby bit node i is the bit node associated with column i of the original parity check matrix. These bit node groups are {1,2,3,4}, {5,6,7,8}, {9,10,11,12}, and {13,14,15,16}.

Similarly, check node i is the check node associated with row i of the original parity check matrix. The check nodes are partitioned into two groups: {1,2,3,4} and {5,6,7,8}. In this example, four parallel processors are employed (n=4). With respect to bit node processing, the first row is read into the four parallel processors 903, whereby the intermediate results will be produced and buffered in a separate memory since the end goal is to update the edges associated with bit node {1,2,3,4}. This is accomplished after all the original edge values of {1,2,3,4} are processed.

It is noted that all the edge values associated with bit node {1,2,3,4} reside in the first three rows of the edge matrix. Thus, in the next access cycle, either the second row or the third row will continue to be accessed. If the process begins with any other row, additional intermediate results will need to be buffered. After all the rows associated with bit node {1,2,3,4} are processed and the edge values are updated, the other groups of bit nodes are processed.

Likewise, the above procedure is carried out at the check nodes. That is, the check nodes are processed in groups, and after all the edges associated with this group have been updated, the next group is processed. In each access cycle, precisely one value from the edge matrix is fetched for each node being actively processed, thereby ensuring that none of the processors 903 is over loaded (or under utilized, for that matter).

It is recognized that the three conditions for efficient parallel processing (as described in steps 803-807 of FIG. 8) can be somewhat restrictive, whereby an arbitrary LDPC code will not generally satisfy these conditions. This restriction can be relaxed by deriving a different matrix from the mapped matrix, as explained below.

Figure 10:
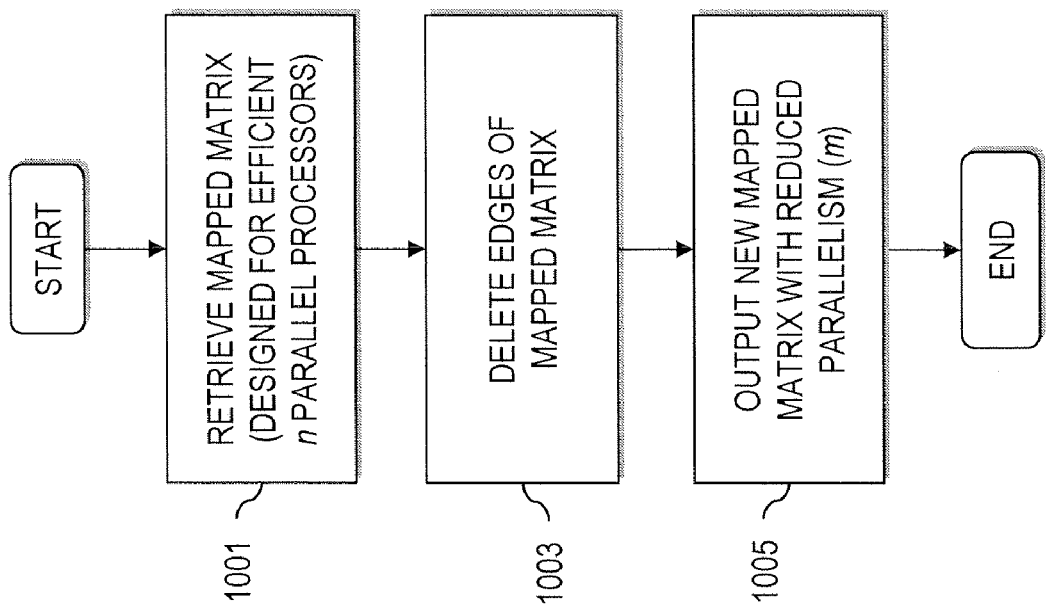
FIG. 10 is a flowchart of a process for generating a derived mapped matrix to accommodate parallel decoding, according to various embodiments of the present invention.

FIG. 10 is a flowchart of a process for generating the derived mapped matrix to accommodate parallel decoding, according to various embodiments of the present invention. To better understand the generation of the derived mapped matrix, certain terminologies and theorems are set forth as follows. An n×n matrix is termed "a density balanced matrix" if every row and every column of the matrix has exactly the same number of nonzero entries. One example of a density balanced matrix is the all-zero matrix; this matrix is extensively used for LDPC code construction.

Another example of a density balanced matrix is a matrix with the following properties. Assuming $b_0 b_1 \ldots b_{n-1}$ is a binary vector, and a is relatively prime to n, then the matrix with entry at ith row and jth column equals $b_{ai+j}$ is a density balanced matrix. In particular, when a=1, a circulant matrix results.

It is noted that any row and/or column permutation of a density balanced matrix results in a density balanced matrix. However, because different component matrices may be permutated differently, fundamentally different LDPC codes result by using building blocks of different permutations. For a density balanced matrix, if the number of nonzero entries in one row is k, all the nonzero entries can be mapped (one to one) into a dense matrix of k by n by taking one nonzero entry from each row at one time.

The following theorem is proposed (Theorem 1): a LDPC code satisfies all three conditions for n efficient parallel decoding if and only if there is a parity check matrix of the LDPC code that is permutation equivalent to a block matrix, $$\begin{bmatrix} A_{11} & A_{12} & \ldots & \ldots & A_{1u} \\ A_{21} & A_{22} & \ldots & \ldots & A_{2u} \\ \vdots & \vdots & \vdots & \vdots & \vdots \\ A_{v1} & A_{v2} & \ldots & \ldots & A_{vu} \end{bmatrix}$$

such that each of the component block matrix $A_{ij}$ is a n×n density balanced matrix. It should be noted that a matrix so constructed does not necessarily yield a regular LDPC code.

Given the constraint imposed by the theorem on the structure of the parity check matrix, it is clear that a general parity check matrix will not satisfy these conditions. Thus, it is necessary to design the code with this structural constraint to be able to be decoded with efficient memory access.

It is recognized that a code that can be efficiently parallel decodable with n parallel engines may not be efficient parallel decodable for other quantities (i.e., with number of engines other than n). As previously noted, to account for future advancements in processing, less parallelism is desired for future receivers. However, all the conditions for efficient parallel processing need to be satisfied even in such a case of reduced parallelism.

To preserve the three conditions for efficiently parallel processing for fewer than n processors, another theorem is proposed (Theorem 2). Let the following matrix be a parity check matrix, whereby each of the block matrix $A_{ij}$ is n×n density balanced matrices:

$$\begin{bmatrix} A_{11} & A_{12} & \ldots & \ldots & A_{1u} \\ A_{21} & A_{22} & \ldots & \ldots & A_{2u} \\ \vdots & \vdots & \vdots & \vdots & \vdots \\ A_{v1} & A_{v2} & \ldots & \ldots & A_{vu} \end{bmatrix}$$

If $A_{11}$ can be decomposed under row and column permutation into a matrix, $$A_{11} = \begin{bmatrix} B_{11} & B_{12} & \ldots & \ldots & B_{1p} \\ B_{21} & B_{22} & \ldots & \ldots & B_{2p} \\ \vdots & \vdots & \vdots & \vdots & \vdots \\ B_{q1} & B_{q2} & \ldots & \ldots & B_{qp} \end{bmatrix}$$

such that each of $B_{ij}$ is a m×m density balanced matrices, and for all other $A_{ij} \neq A_{11}$, the block matrices can be decomposed into block density balanced submatrices under the same row and column permutation as $A_{11}$, then the LDPC code defined by the following:

$$\begin{bmatrix} A_{11} & A_{12} & \ldots & \ldots & A_{1u} \\ A_{21} & A_{22} & \ldots & \ldots & A_{2u} \\ \vdots & \vdots & \vdots & \vdots & \vdots \\ A_{v1} & A_{v2} & \ldots & \ldots & A_{vu} \end{bmatrix}$$

The above matrix satisfies the conditions for efficient parallel processing with both n and m parallelism.

By way of example, the following is defined: $A_{ij}$ are circulant matrices of n×n, and m is any integer fraction of n. The row and columns of $A_{ij}$ are labeled from 0, 1, . . . n. The submatrix of $A_{ij}$, which consists of all the elements whose row and column index are equal to a constant modulo m, is also circulant. Consequently, all the $A_{ij}$'s under the same row and column permutation are again decomposable into circular submatrices. This implies that a LDPC code with $A_{ij}$'s as component code satisfies the conditions for efficient parallel processing with both n and m parallelism (here m is any integer fraction of n).

Given any LDPC code with parity check matrix H, other LDPC codes can be derived from H by converting some of the nonzero entries of H into zeros. Any code obtained this way is termed a "derived code of the original LDPC code." In step 1001, the mapped matrix for the n parallel decodable code is retrieved. If the original code is n parallel decoding with full dense memory of n parallel engines check matrix, any derived code can also be n parallel decodable with reduced density memory matrix.

In view of the bipartite graph, the derived code can be obtained by deleting some edges (step 1003). The mapped matrix of the derived code is essentially the same as the mapped matrix of the base code; however, the entries corresponding to the deleted edges can be marked as "DON'T CARE" (i.e., null values). These memory cells are thus wasted, and access cycles are expended in fetching the null values. However, as long as the total number of edge deletions is relatively small, it will not significantly impact the efficiency. Such derived code can exhibit other desired properties, such as ease of encoding and improved distance properties. In step 1005, the derived mapped matrix is output.

Figure 11:
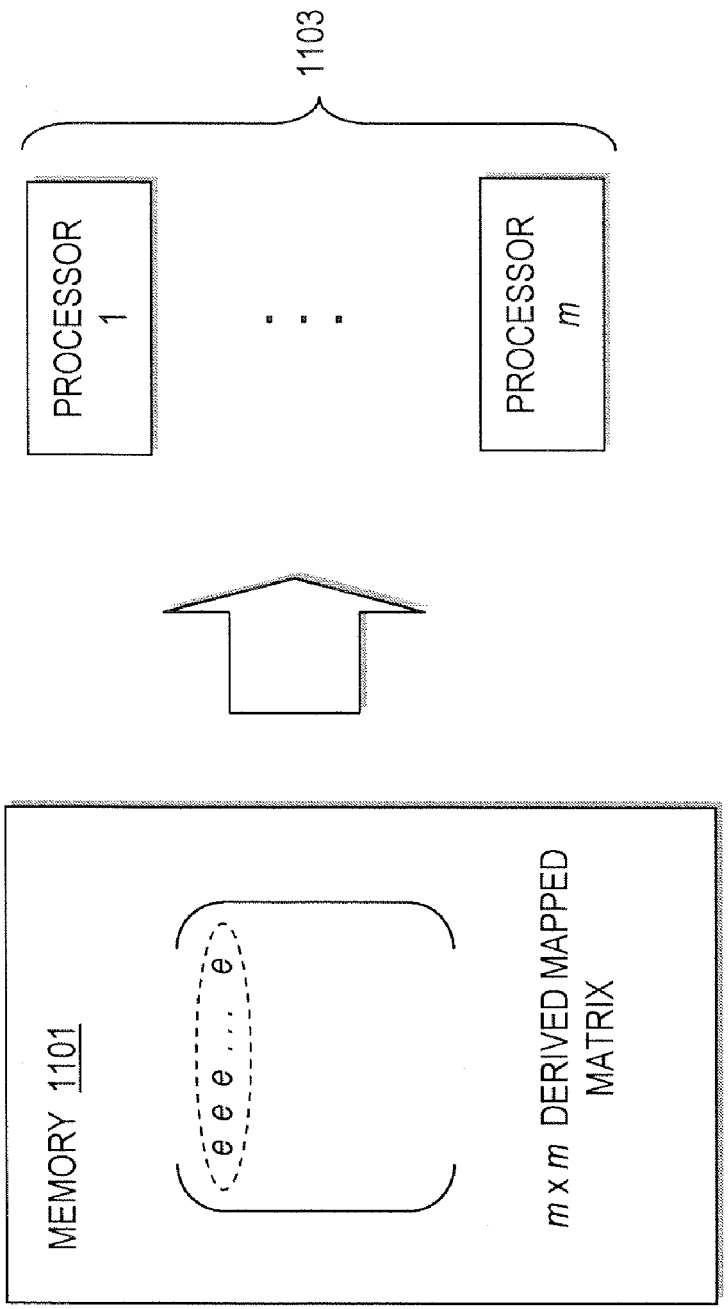
FIG. 11 is a diagram of an LDPC decoder with memory storing the derived mapped matrix of edge values for supporting parallel decoding, according to an embodiment of the present invention.

FIG. 11 is a diagram of an LDPC decoder with memory storing a derived mapped matrix of edge values for supporting parallel decoding, according to an embodiment of the present invention. This matrix is then stored in memory 1101 for access by the m processors 1103. Under this arrangement, there is great flexibility in the number of parallel engines that are used, while preserving an efficient memory architecture.

Figure 12:
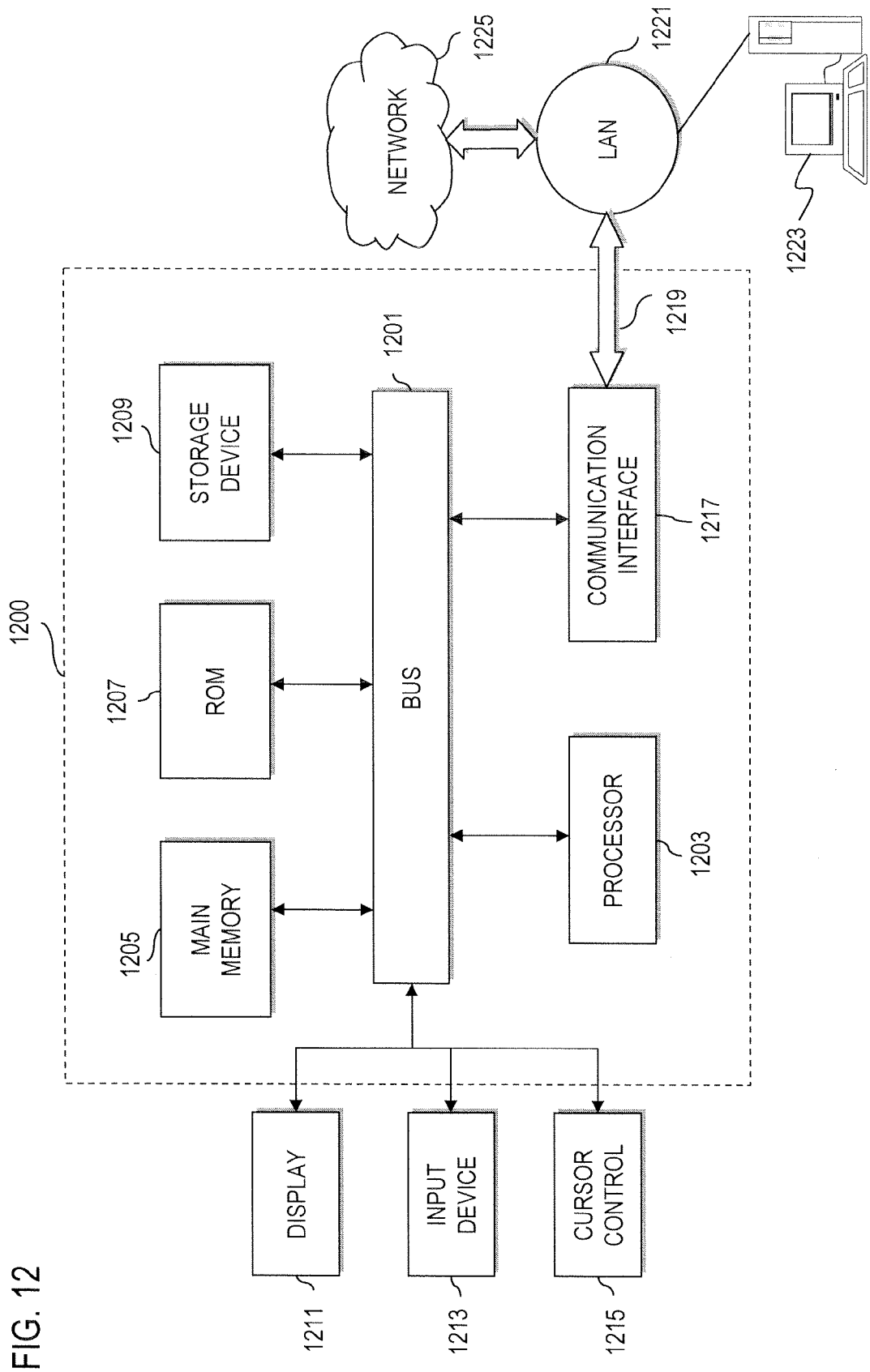
FIG. 12 is a diagram of a computer system that can perform the processes of encoding and decoding of LDPC codes, in accordance with embodiments of the present invention.

FIG. 12 illustrates a computer system upon which an embodiment according to the present invention can be implemented. The computer system 1200 includes a bus 1201 or other communication mechanism for communicating information, and a processor 1203 coupled to the bus 1201 for processing information. The computer system 1200 also includes main memory 1205, such as a random access memory (RAM) or other dynamic storage device, coupled to the bus 1201 for storing information and instructions to be executed by the processor 1203. Main memory 1205 can also be used for storing temporary variables or other intermediate information during execution of instructions to be executed by the processor 1203. The computer system 1200 further includes a read only memory (ROM) 1207 or other static storage device coupled to the bus 1201 for storing static information and instructions for the processor 1203. A storage device 1209, such as a magnetic disk or optical disk, is additionally coupled to the bus 1201 for storing information and instructions.

The computer system 1200 may be coupled via the bus 1201 to a display 1211, such as a cathode ray tube (CRT), liquid crystal display, active matrix display, or plasma display, for displaying information to a computer user. An input device 1213, such as a keyboard including alphanumeric and other keys, is coupled to the bus 1201 for communicating information and command selections to the processor 1203. Another type of user input device is cursor control 1215, such as a mouse, a trackball, or cursor direction keys for communicating direction information and command selections to the processor 1203 and for controlling cursor movement on the display 1211.

According to one embodiment of the invention, parallel decoding of LDPC codes is provided by the computer system 1200 in response to the processor 1203 executing an arrangement of instructions contained in main memory 1205. Such instructions can be read into main memory 1205 from another computer-readable medium, such as the storage device 1209. Execution of the arrangement of instructions contained in main memory 1205 causes the processor 1203 to perform the process steps described herein. One or more processors in a multi-processing arrangement may also be employed to execute the instructions contained in main memory 1205. In alternative embodiments, hard-wired circuitry may be used in place of or in combination with software instructions to implement the embodiment of the present invention. Thus, embodiments of the present invention are not limited to any specific combination of hardware circuitry and software.

The computer system 1200 also includes a communication interface 1217 coupled to bus 1201. The communication interface 1217 provides a two-way data communication coupling to a network link 1219 connected to a local network 1221. For example, the communication interface 1217 may be a digital subscriber line (DSL) card or modem, an integrated services digital network (ISDN) card, a cable modem, or a telephone modem to provide a data communication connection to a corresponding type of telephone line. As another example, communication interface 1217 may be a local area network (LAN) card (e.g. for Ethernet™ or an Asynchronous Transfer Model (ATM) network) to provide a data communication connection to a compatible LAN. Wireless links can also be implemented. In any such implementation, communication interface 1217 sends and receives electrical, electromagnetic, or optical signals that carry digital data streams representing various types of information. Further, the communication interface 1217 can include peripheral interface devices, such as a Universal Serial Bus (USB) interface, a PCMCIA (Personal Computer Memory Card International Association) interface, etc.

The network link 1219 typically provides data communication through one or more networks to other data devices. For example, the network link 1219 may provide a connection through local network 1221 to a host computer 1223, which has connectivity to a network 1225 (e.g. a wide area network (WAN) or the global packet data communication network now commonly referred to as the "Internet") or to data equipment operated by service provider. The local network 1221 and network 1225 both use electrical, electromagnetic, or optical signals to convey information and instructions. The signals through the various networks and the signals on network link 1219 and through communication interface 1217, which communicate digital data with computer system 1200, are exemplary forms of carrier waves bearing the information and instructions.

The computer system 1200 can send messages and receive data, including program code, through the network(s), network link 1219, and communication interface 1217. In the Internet example, a server (not shown) might transmit requested code belonging to an application program for implementing an embodiment of the present invention through the network 1225, local network 1221 and communication interface 1217. The processor 1203 may execute the transmitted code while being received and/or store the code in storage device 129, or other non-volatile storage for later execution. In this manner, computer system 1200 may obtain application code in the form of a carrier wave.

The term "computer-readable medium" as used herein refers to any medium that participates in providing instructions to the processor 1203 for execution. Such a medium may take many forms, including but not limited to non-volatile media, volatile media, and transmission media. Non-volatile media include, for example, optical or magnetic disks, such as storage device 1209. Volatile media include dynamic memory, such as main memory 1205. Transmission media include coaxial cables, copper wire and fiber optics, including the wires that comprise bus 1201. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the various embodiments of the present invention provide an approach for decoding a structured Low Density Parity Check (LDPC) codes. Criteria for parallel decodable codes are established to generate a mapped matrix corresponding to a parity check matrix. These criteria result in LDPC codes that exploit the parallel decoding structure of LDPC codes and provide efficient memory architecture. The approach also permits preservation of these parallel decodable conditions for efficient parallel processing for fewer than n processors (i.e., m processors such that m is an integer fraction of n). Under the above arrangement, decoder resources, such as memory and processing engines, are employed efficiently. Also, implementation flexibility is enhanced, whereby m parallel engines can be used.

While the present invention has been described in connection with a number of embodiments and implementations, the present invention is not so limited but covers various obvious modifications and equivalent arrangements, which fall within the purview of the appended claims.

What is claimed is:

1. A method comprising:
   decoding, by a plurality of processors operating in parallel, low density parity check (LDPC) codes by accessing a mapped matrix in a memory structure, wherein the mapped matrix is constructed based on a parity check matrix of the LDPC codes,
   wherein no two different entries in an identical row of the mapped matrix connect to identical bit nodes or identical check nodes.

2. A method according to claim 1, further comprising:
   if bit node group, $BG_i$, represents all bit nodes connected to edges in an ith row, for $i \neq j$, $BG_i$ and $BG_j$, verifying that $BG_i$ either has no any common node or is identical; and
   if check node group, $CG_i$, represents all the check nodes connected to edges in an ith row, for $i \neq j$, $CG_i$ and $CG_j$, verifying that $CG_i$ either has no any common node or is identical.

3. A method according to claim 1, wherein the parity check matrix is permutation equivalent to a block matrix having entries of n×n density balanced matrices.

4. A method according to claim 3, wherein one of the entries of the n×n density balanced matrices is a m×m density balanced matrix, and other entries of the n×n density balanced matrices are decomposable into block density balanced sub-matrices.

5. A method according to claim 4, wherein m is an integer fraction of n.

6. A method according to claim 1, wherein the LDPC codes are represented by a signal modulated according to a signal constellation that comprises at least one of 8-PSK (Phase Shift Keying) or QPSK (Quadrature Phase Shift Keying).

7. A method according to claim 6, further comprising operating a transmitter to transmit the signal over a satellite link.

8. A receiver configured to receive a signal representing the LDPC codes in accordance with claim 1.

9. A method comprising:
generating low density parity check (LDPC) codes by a processor,
wherein the LDPC codes are arranged to be decoded in parallel by a plurality of processors using a mapped matrix that is constructed based on a parity check matrix of the LDPC codes,
wherein no two different entries in an identical row of the mapped matrix connect to identical bit nodes or identical check nodes.

10. A method according to claim 9, further comprising:
if bit node group, $BG_i$, represents all bit nodes connected to edges in an ith row, for $i \neq j$, $BG_i$ and $BG_j$, verifying that $BG_i$ either has no any common node or is identical; and
if check node group, $CG_i$, represents all the check nodes connected to edges in an ith row, for $i \neq j$, $CG_i$ and $CG_j$, verifying that $CG_i$ either has no any common node or is identical.

11. A method according to claim 9, wherein the parity check matrix is permutation equivalent to a block matrix having entries of n×n density balanced matrices.

12. A method according to claim 11, wherein one of the entries of the n×n density balanced matrices is a m×m density balanced matrix, and other entries of the n×n density balanced matrices are decomposable into block density balanced submatrices.

13. A method according to claim 12, wherein m is an integer fraction of n.

14. A method according to claim 9, wherein the LDPC codes are represented by a signal modulated according to a signal constellation that comprises at least one of 8-PSK (Phase Shift Keying) or QPSK (Quadrature Phase Shift Keying).

15. A method according to claim 14, wherein the signal is transmitted over a satellite link.

16. A transmitter configured to transmit a signal representing the LDPC codes in accordance with claim 9.

17. An apparatus comprising:
logic configured to determine that none of any two different entries in an identical row of a mapped matrix connects to identical bit nodes or identical check nodes, wherein the mapped matrix is based on a parity check matrix corresponding to low density parity check (LDPC) codes, the mapped matrix being stored into memory that is accessible by a plurality of processors operating in parallel to decode the LDPC codes,
wherein the logic is further configured, if bit node group, $BG_i$, represents all bit nodes connected to edges in an ith row, for $i \neq j$, $BG_i$ and $BG_j$, to verify that $BG_i$ either has no any common node or is identical,
wherein the logic is further configured, if check node group, $CG_i$, represents all the check nodes connected to edges in an ith row, for $i \neq j$, $CG_i$ and $CG_j$, to verify that $CG_i$ either has no any common node or is identical.

18. An apparatus according to claim 17, wherein the number of processors is n, the logic being further configured to delete edge values within the mapped matrix to output a derived mapped matrix, wherein the derived mapped matrix is used by m parallel processors, m being less than n.

19. An apparatus comprising:
a memory structure comprising a mapped matrix that is based on a parity check matrix of low density parity check (LDPC) codes, wherein no two different entries in an identical row of the mapped matrix connect to identical bit nodes or identical check nodes; and
a plurality of processors configured to operate in parallel accessing the mapped matrix to decode the LDPC codes.

20. The apparatus of claim 19, wherein the parity check matrix is permutation equivalent to a block matrix having entries of n×n density balanced matrices.

21. The apparatus of claim 20, wherein one of the entries of the n×n density balanced matrices is a m×m density balanced matrix, and other entries of the n×n density balanced matrices are decomposable into block density balanced submatrices.

22. The apparatus of claim 21, wherein m is an integer fraction of n.

23. The apparatus of claim 19, wherein the LDPC codes are represented by a signal modulated according to a signal constellation that comprises at least one of 8-PSK (Phase Shift Keying) or QPSK (Quadrature Phase Shift Keying).

24. The apparatus of claim 23, further comprising a transmitter configured to transmit the signal over a communication link.

\* \* \* \* \*